(12) United States Patent
Kanbara et al.

(10) Patent No.: US 12,521,730 B2
(45) Date of Patent: Jan. 13, 2026

(54) DIELECTROPHORESIS DEVICE

(71) Applicant: Yokogawa Electric Corporation, Tokyo (JP)

(72) Inventors: Nobuhiko Kanbara, Tokyo (JP); Takashi Aoto, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 196 days.

(21) Appl. No.: 18/373,367

(22) Filed: Sep. 27, 2023

(65) Prior Publication Data

US 2024/0109078 A1 Apr. 4, 2024

(30) Foreign Application Priority Data

Sep. 29, 2022 (JP) ................. 2022-156275

(51) Int. Cl.
*B03C 5/00* (2006.01)
*B01L 3/00* (2006.01)

(52) U.S. Cl.
CPC ........ *B03C 5/005* (2013.01); *B01L 3/502761* (2013.01); *B01L 2400/0424* (2013.01)

(58) Field of Classification Search
None
See application file for complete search history.

(56) References Cited

U.S. PATENT DOCUMENTS

| | | | |
|---|---|---|---|
| 5,225,706 | A | 7/1993 | Berger et al. |
| 9,908,115 | B2 | 3/2018 | Hoobbs et al. |

(Continued)

FOREIGN PATENT DOCUMENTS

| | | | |
|---|---|---|---|
| JP | 02-138772 A | 5/1990 | |
| JP | 2007-537729 A | 12/2007 | |

(Continued)

OTHER PUBLICATIONS

I. Jonak-Auer, et al., "Optimized Integrated PIN Photodiodes with Improved Backend Layers", Sensors & Transducers, 237(9-10): p. 67-74, Sep. 2019.*

(Continued)

*Primary Examiner* — J. Christopher Ball
(74) *Attorney, Agent, or Firm* — RANKIN, HILL & CLARK LLP

(57) ABSTRACT

Provided is a variable conductivity film exhibiting a large change in conductivity so as to facilitate movement or sorting of micro-materials. Silicon semiconductor layers disposed between a first electrode and a second electrode include: a first silicon layer of a first conductivity type with a first impurity concentration; a second silicon layer of a second conductivity type different from the first conductivity type, contacting the first silicon layer and having a second impurity concentration smaller than the first impurity concentration; and a third silicon layer of the first conductivity type contacting the second silicon layer and having a third impurity concentration larger than the second impurity concentration. The first silicon layer and the second silicon layer form a first photodiode having a first polarity, and the second silicon layer and the third silicon layer form a second photodiode having a second polarity and being connected in series to the first photodiode.

2 Claims, 3 Drawing Sheets

(56) References Cited

U.S. PATENT DOCUMENTS

2009/0170186 A1    7/2009   Wu et al.
2010/0101960 A1    4/2010   Ohta et al.
2014/0124370 A1    5/2014   Short et al.

FOREIGN PATENT DOCUMENTS

JP    2015-132615 A    7/2015
JP    2016-505349 A    2/2016
JP    2018-508366 A    3/2018
WO    2010/102567 A1    9/2010

OTHER PUBLICATIONS

Zhang et al., "Patterned Optoelectronic Tweezers: A New Scheme for Selecting, Moving, and Storing Dielectric Particles and Cells", Small, 2018, 14, 1803342, total 11 pages; Cited in Specification.

Hsu et al., "Phototransistor-based optoelectronic tweezers for dynamic cell manipulation in cell culture media", Lab on Chip, 2010, 10, pp. 165-172; Cited in Specification.

Extended European Search Report (EESR) dated Feb. 27, 2024 for European Patent Application No. 23198258.8.

Japanese Office Action (JPOA) dated Aug. 5, 2025 issued for Japanese patent application No. 2022-156275 and its English machine translation.

\* cited by examiner

DIELECTROPHORESIS DEVICE

CROSS REFERENCE TO RELATED APPLICATIONS

The present application claims priority from Japanese patent application JP 2022-156275 filed on Sep. 29, 2022, the entire content of which is hereby incorporated by reference into this application.

BACKGROUND

Technical Field

The present disclosure relates to a dielectrophoresis device.

Background Art

A dielectrophoresis device is known as a device capable of manipulating, in a liquid, micro-objects, such as cells and microparticles (the term "micro-objects" as used herein means inorganic and organic materials with a diameter on the order of several nm to 100 µm). The dielectrophoresis device is configured to illuminate a variable conductivity film with light to give a conductivity change in the variable conductivity film, and also apply an AC voltage signal between opposing electrodes to cause a dielectrophoresis phenomenon. The dielectrophoresis phenomenon can move or sort the micro-objects to desired positions.

The conventional dielectrophoresis devices described in Shuailong et al., Small 2018, 14, 1803342, Patterned Optoelectronic Tweezers: A New Scheme for Selecting, Moving, and Storing Dielectric Particles and Cells and JP 2007-537729 A use an amorphous silicon film as a variable conductivity film in which conductivity changes by light. With light illumination, the conductivity of amorphous silicon changes from about $1.0 \times 10^{-10}$ S/m to about $5 \times 10^{-6}$ S/m. In contrast, the conductivity of solvent, such as pure water, is about $2.0 \times 10^{-4}$ S/m. In this case, the ratio of the conductivity of solvent to the conductivity of amorphous silicon is about 100 to 1, and thus a voltage required for dielectrophoresis can be applied across the solvent.

However, the conductivity of PBS (Phosphate-buffered saline) or DMEM (Dulbecco's Modified Eagle Medium) that is a buffer solution used for cell culture and the like is 1.6 S/m. This is about $10^6$ times larger than the conductivity of the amorphous silicon film. Since they have such a large difference in conductivity, when the amorphous silicon film is used as a variable conductivity film as described in JP 2007-537729 A, a desired voltage may not be applied across the solvent, making it difficult to perform dielectrophoresis.

For a greater range of change in conductivity of the amorphous silicon film, JP 2016-505349 A describes a dielectrophoresis device including a multi-layer film that constitutes a phototransistor. Unfortunately, in the phototransistor structure, the circuit functions only when the base layer is in a thin-film state. In the thin base layer, the region (the width in the height direction) of a depletion layer, in which the conductivity changes, is small and the efficiency of optical absorption is low, resulting in a small change in the conductivity.

Also, Hsu et al., Lab Chip, 2010, 10, 165-172, Phototransistor-based optoelectronic tweezers for dynamic cell manipulation in cell culture media, describes a related technique.

SUMMARY

The present disclosure provides a variable conductivity film exhibiting a large change in conductivity, and thus provides a dielectrophoresis device that can easily move or sort micro-materials.

In view of the foregoing, a dielectrophoresis device according to the present disclosure includes: a solvent retaining portion containing a solvent including micro-objects to be manipulated; a first electrode disposed at a first surface side of the solvent retaining portion; a second electrode disposed at a second surface side of the solvent retaining portion; and silicon semiconductor layers disposed between the first electrode and the second electrode. The silicon semiconductor layers include: a first silicon layer of a first conductivity type with a first impurity concentration; a second silicon layer of a second conductivity type with a second impurity concentration, the second silicon layer contacting the first silicon layer, the second impurity concentration being smaller than the first impurity concentration, the second conductivity type being different from the first conductivity type; and a third silicon layer of the first conductivity type with a third impurity concentration, the third silicon layer contacting the second silicon layer, the third impurity concentration being larger than the second impurity concentration. The first silicon layer and the second silicon layer form a first photodiode having a first polarity, and the second silicon layer and the third silicon layer form a second photodiode having a second polarity opposite to the first polarity and being connected in series to the first photodiode.

According to the present disclosure, it is possible to provide a variable conductivity film exhibiting a large change in conductivity, and thus provide a dielectrophoresis device that can easily move or sort micro-materials.

DETAILED DESCRIPTION

The following describes embodiments with reference to the attached drawings. In the attached drawings, functionally identical elements may be denoted by identical numerals. Note that the attached drawings illustrate embodiments and implementation examples in accordance with the principles of the present disclosure. However, these are provided to assist an understanding of the present disclosure and should not be construed as limiting the present disclosure. Description in this specification is merely a typical example, and is not to limit claims or application examples of the present disclosure in any sense.

While the embodiments are described in sufficient detail to enable a person skilled in the art to practice the present disclosure, other implementations and configurations are also possible, and it should be understood that changes in configurations and structures and replacement of various components are allowed without departing from the scope and spirit of the technical concepts of the present disclosure. Accordingly, the following description should not be interpreted in a limiting sense.

First Embodiment

Figure 1:
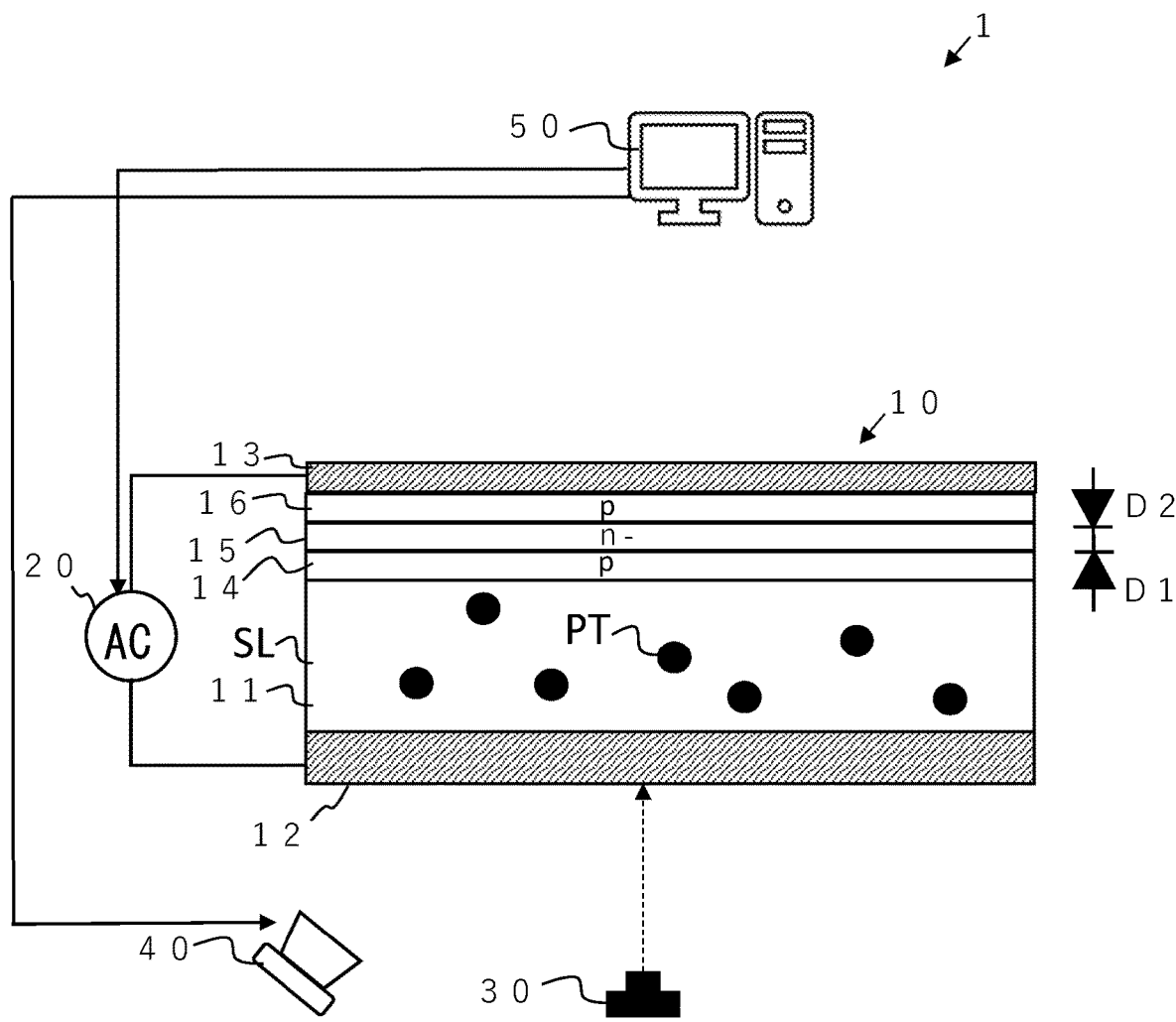
FIG. 1 is a schematic diagram illustrating a dielectrophoresis device according to a first embodiment.

Next, a dielectrophoresis device 1 according to the first embodiment will be described with reference to FIG. 1. In one example, this dielectrophoresis device 1 includes an electrophoresis portion 10, an AC power source 20, a light source 30, a CCD camera 40, and a controller 50.

The electrophoresis portion 10 is a portion for separating micro-objects (for example, cells PT) in the electrophoresis portion 10 using the dielectrophoresis phenomenon. The AC power source 20 supplies an AC power for causing the dielectrophoresis phenomenon in the electrophoresis portion 10. The light source 30 emits light for changing the conductivity in silicon layers serving as a variable conductivity film in the electrophoresis portion 10. The CCD camera 40 is an imaging device for capturing an image of the electrophoresis portion 10 and determining the position or the like of the separated cells PT. The controller 50 analyzes the image captured by the CCD camera 40 and has control over the dielectrophoresis device 1.

The electrophoresis portion 10 includes a solvent retaining portion 11, a first electrode 12, a second electrode 13, and silicon layers 14 to 16. As described later, regarding the silicon layers 14 to 16, their conductivity can be partially changed by illuminating with light from the light source 30.

The electrophoresis portion 10 includes the solvent retaining portion 11 containing a solvent including micro-objects PT (cells and the like) to be manipulated. When the micro-objects PT are cells, the solvent retaining portion 11 retains therein PBS (Phosphate-buffered saline) or DMEM (Dulbecco's Modified Eagle Medium) as a solvent SL (buffer solution), and the solvent SL includes cells PT as micro-objects. Each of these cells PT is moved to a desired position in the solvent retaining portion 11 using the dielectrophoresis phenomenon, so that the cells PT may be separated and identified.

The first electrode 12 (ITO electrode) is disposed at a lower surface (first surface) side of the solvent retaining portion 11, and the second electrode 13 (p-type silicon substrate) is disposed at an upper surface (second surface) side of the solvent retaining portion 11 with the silicon layers 14 to 16 (described later) interposed therebetween. The first electrode 12 is a transparent electrode made of indium tin oxide (ITO) or the like. The AC power source 20 supplies an AC power between the first electrode 12 and the second electrode 13. The solvent retaining portion 11 is illuminated with the light from the light source 30 via the first electrode 12. This causes a change in the conductivity of the solvent SL at the light illuminated position, and enables separation of the cells PT using the dielectrophoresis phenomenon.

Between the second surface of the solvent retaining portion 11 and the second electrode 13 (p-type silicon substrate), a p-type silicon layer 14 (heavily doped p-type silicon layer), an n$^-$-type silicon layer 15 (lightly doped n$^-$-type silicon layer), and a p-type silicon layer 16 (heavily doped p-type silicon layer) are deposited in this order from the lower side. These three silicon layers form a variable conductivity film. The p-type silicon layers 14 and 16 have a higher impurity concentration than the n$^-$-type silicon layer 15. The n$^-$-type silicon layer 15 contacts the p-type silicon layer 14 to form a pn junction therebetween. The p-type silicon layer 16 contacts the n$^-$-type silicon layer 15 on the opposite side of the p-type silicon layer 14 to form a pn junction therebetween.

The p-type silicon layer 14 and the n$^-$-type silicon layer 15 form a first photodiode D1 with the direction from the lower side toward the upper side being its forward direction. The p-type silicon layer 16 and the n$^-$-type silicon layer 15 form a second photodiode D2 with the direction from the upper side toward the lower side being its forward direction. The first photodiode D1 and the second photodiode D2 are connected in series (their cathodes are connected to each other) and have opposite polarities. When an AC voltage is applied between the first electrode 12 and the second electrode 13, one of the first photodiode D1 or the second photodiode D2 is in forward bias and the other one of the first photodiode D1 or the second photodiode D2 is in reverse bias.

In one example, the p-type silicon layer 14 and the p-type silicon layer 16 may have a thickness in the stacking direction of about 1000 to 2000 Å and an impurity concentration of around $1 \times 10^{18}$ cm$^{-3}$. The n$^-$-type silicon layer 15 may have a thickness in the stacking direction larger than those of the p-type silicon layers 14 and 16, for example, about 5000 Å to 1 μm, and an impurity concentration of about $1 \times 10^{15}$ cm$^{-3}$, which is smaller than those of the p-type silicon layers 14 and 16. A larger thickness and a smaller impurity concentration of the n$^-$-type silicon layer 15 can increase the width of the depletion layer in the n$^-$-type silicon layer 15. A wider depletion layer can increase the difference in conductivity of the silicon layers between with and without illumination by the light source 30, allowing dielectrophoresis to easily occur.

Now, the operation of the dielectrophoresis device 1 according to the first embodiment will be described. In the dielectrophoresis, an AC voltage is applied to the electrophoresis portion 10 from the AC power source 20 via the first electrode 12 and the second electrode 13.

While a positive voltage is applied to the second electrode 13 (p-type silicon substrate) by the AC voltage, in the second photodiode D2 formed by the p-type silicon layer 16 and the n$^-$-type silicon layer 15, a forward voltage is applied across the diode. Meanwhile, in the photodiode D1 formed by the n$^-$-type silicon layer 15 and the p-type silicon layer 14, a reverse voltage is applied across the diode. The resistance value increases in the photodiode D1, resulting in the presence of a voltage thereacross, and a voltage will not be applied to the solvent retaining portion 11. When such a portion with an increase in voltage value is illuminated with light from the light source 30, the illumination light is absorbed in the depletion layer formed in the n-type silicon layer of the reverse biased photodiode D1, generating electron-hole pairs. The electron-hole pairs serve to specifically pass current only through the illuminated area and apply a voltage to the solvent SL. This can form a local electric field and cause dielectrophoresis.

In contrast, while a positive voltage is applied to the first electrode 12 by the AC voltage, in the first photodiode D1 formed by the p-type silicon layer 14 and the n$^-$-type silicon layer 15, a forward voltage is applied across the diode. Meanwhile, in the photodiode D2 formed by the n$^-$-type silicon layer 15 and the p-type silicon layer 16, a reverse voltage is applied across the diode. The resistance value increases in the photodiode D2, resulting in the presence of a voltage thereacross, and a voltage will not be applied to the solvent retaining portion 11. When such a portion with an increase in voltage value is illuminated with light from the light source 30, the illumination light is absorbed in the depletion layer formed in the n$^-$-type silicon layer 15 of the reverse biased photodiode D2, generating electron-hole pairs. The electron-hole pairs serve to specifically pass current only through the illuminated area and apply a voltage to the solvent SL. This can form a local electric field and cause dielectrophoresis.

As described above, in the dielectrophoresis device 1 of the first embodiment, the silicon layers 14 to 16 have a P/N/P configuration and form the photodiodes D1, D2 connected in series with opposite polarities. This can increase the conductivity of the silicon layers 14 to 16 at a position illuminated with light from the light source 30, and cause dielectrophoresis in the solvent at the area with an increased conductivity. When such a configuration is employed, the width of the depletion layer produced by the P/N/P configuration can be set to a desired length, and thus the electrode resistance can be changed to a desired value. Consequently, the occurrence of an adverse effect on the cells PT to be separated can be reduced. Since this enables dielectrophoresis under lower voltage application conditions or in solvents with higher conductivities, it is possible to increase the number of cell types to which the dielectrophoresis technique can be applied, and to more flexibly set operation environments.

Second Embodiment

Figure 2:
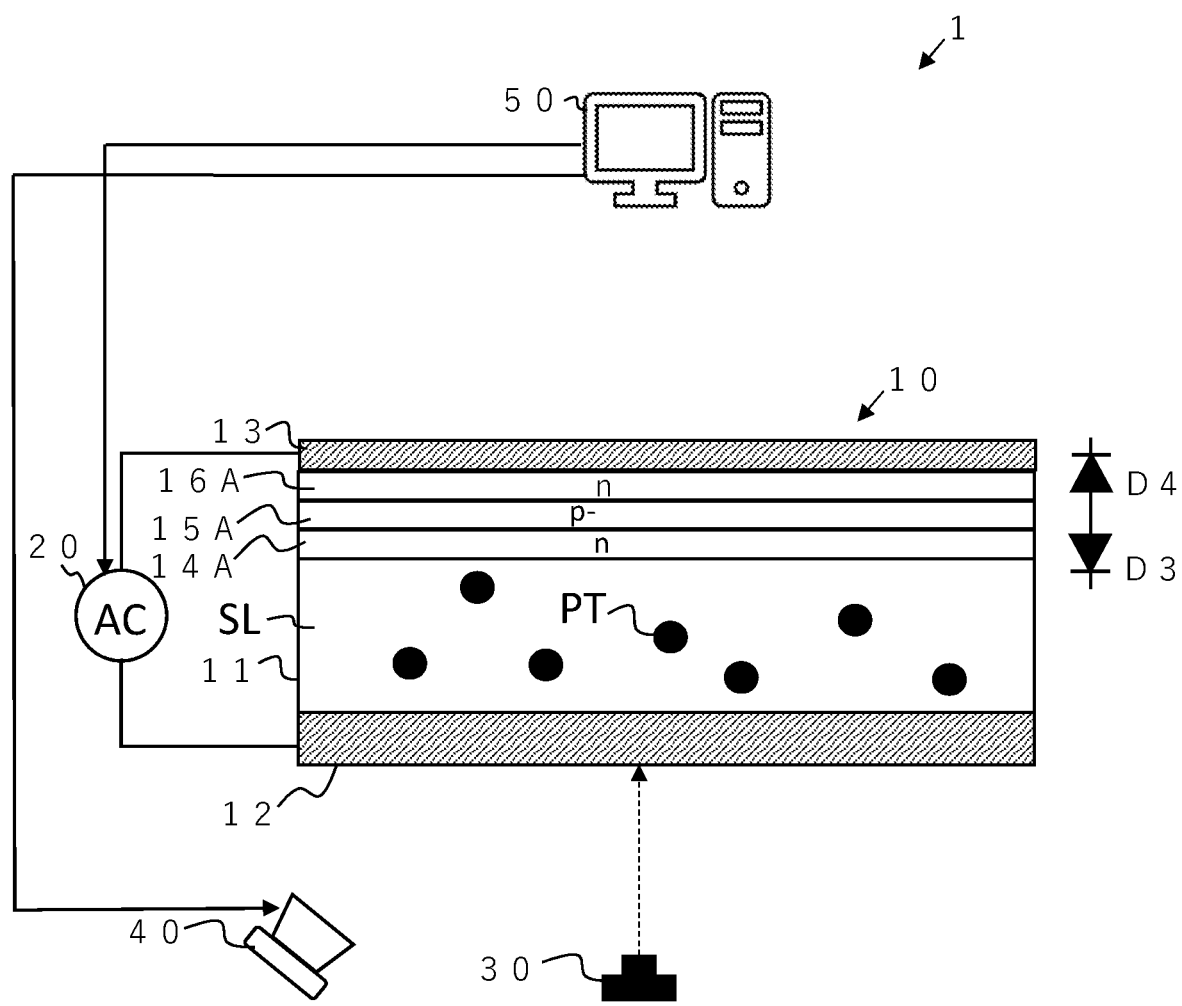
FIG. 2 is a schematic diagram illustrating a dielectrophoresis device according to a second embodiment.

Next, a dielectrophoresis device 1 according to the second embodiment will be described with reference to FIG. 2. In FIG. 2, elements that are identical to those of the first embodiment are denoted by the identical reference numerals as in FIG. 1, and thus repeated description will be omitted in the following. This second embodiment differs from the first embodiment in the configuration of silicon layers as a variable conductivity film.

The silicon layers forming the variable conductivity film of the second embodiment include an n-type silicon layer 14A, a p⁻-type silicon layer 15A, and an n-type silicon layer 16A that are sequentially stacked together. That is, the silicon layers of the dielectrophoresis device of the second embodiment have an N/P/N configuration, which is different from the first embodiment.

Specifically, the n-type silicon layer 14A and the p⁻-type silicon layer 15A form a first photodiode D3 with the direction from the upper side toward the lower side being its forward direction. The n-type silicon layer 16A and the p⁻-type silicon layer 15A form a second photodiode D4 with the direction from the lower side toward the upper side being its forward direction. The first photodiode D3 and the second photodiode D4 are connected in series (their cathodes are connected to each other) and have opposite polarities.

The n-type silicon layer 14A and the n-type silicon layer 16A may have a thickness in the stacking direction of about 1000 to 2000 Å and an impurity concentration of around $1 \times 10^{18}$ cm⁻³. The p⁻-type silicon layer 15A may have a thickness in the stacking direction larger than those of the n-type silicon layers 14A and 16A, for example, about 5000 Å to 1 μm, and an impurity concentration of about $1 \times 10^{15}$ cm⁻³, which is smaller than those of the n-type silicon layers 14A and 16A. A larger thickness and a smaller impurity concentration of the p⁻-type silicon layer 15A can increase the potential difference in the solvent SL of the solvent retaining portion 11 between the area illuminated with light and the area not illuminated with light, allowing dielectrophoresis to easily occur.

According to this configuration, the same advantageous effect as that of the first embodiment can be obtained. That is, when an AC voltage is applied between the first electrode 12 and the second electrode 13, a forward voltage is applied to one of the first photodiode D3 or the second photodiode D4, and a reverse voltage is applied to the other one of the first photodiode D3 or the second photodiode D4, and the resistance value increases. However, illumination with light from the light source 30 can generate electron-hole pairs in the depletion layer of the illuminated area and cause dielectrophoresis.

Third Embodiment

Figure 3:
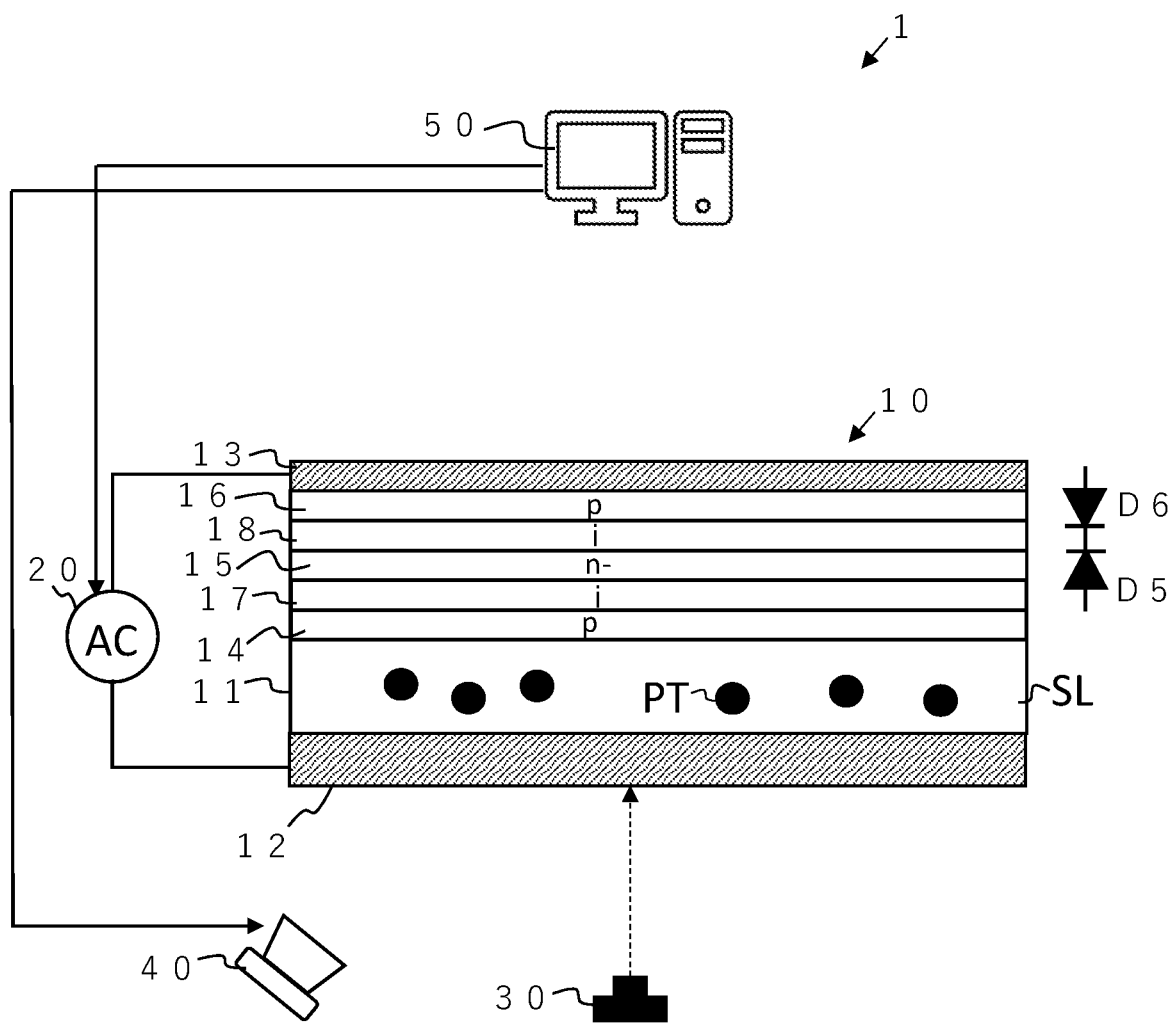
FIG. 3 is a schematic diagram illustrating a dielectrophoresis device according to a third embodiment.

Next, a dielectrophoresis device 1 according to the third embodiment will be described with reference to FIG. 3. In FIG. 3, elements that are identical to those of the first embodiment are denoted by the identical reference numerals as in FIG. 1, and thus repeated description will be omitted in the following. This third embodiment differs from the first embodiment in the configuration of silicon layers as a variable conductivity film.

The silicon layers forming the variable conductivity film of the third embodiment include an i-type silicon layer 17 (intrinsic silicon layer) with no impurities, formed between the p-type silicon layer 14 and the n⁻-type silicon layer 15 and an i-type silicon layer 18 formed between the n⁻-type silicon layer 15 and the p-type silicon layer 16. That is, the silicon layers of the third embodiment have a P/I/N/I/P configuration, which is different from the foregoing embodiments. The terms "with no impurities" and "intrinsic" as used herein are not intended to limit the content of impurities to completely zero, but mean a silicon layer having substantially equal numbers of free electrons and holes produced by thermal energy or the like and including very few free electrons produced from the impurities such that they may be ignored.

The n⁻-type silicon layer 15 contacts the p-type silicon layer 14 via the i-type silicon layer 17 to form a pin junction therebetween. On the opposite side, the n⁻-type silicon layer 15 also contacts the p-type silicon layer 16 via the i-type silicon layer 18 to form a pin junction therebetween.

The p-type silicon layer 14, the i-type silicon layer 17, and the n⁻-type silicon layer 15 form a first photodiode D5 with the direction from the lower side toward the upper side being its forward direction. The p-type silicon layer 16, the i-type silicon layer 18, and the n⁻-type silicon layer 15 form a second photodiode D6 with the direction from the upper side toward the lower side being its forward direction. The first photodiode D5 and the second photodiode D6 are connected in series (their cathodes are connected to each other) and have opposite polarities.

According to this third embodiment, substantially the same advantageous effect as that of the first embodiment can be obtained. In this third embodiment, the silicon layers include the i-type silicon layers 17, 18 to form the two pin-type photodiodes D5, D6 connected in series with opposite polarities, whereby the deletion layer can be formed in a wide range in the reverse biased photodiode. This can easily generate electron-hole pairs during light illumination. Though not illustrated in the drawings, instead of the P/I/N/I/P configuration, silicon layers having an N/I/P/I/N configuration may be employed.

[Others]

It should be noted that the present disclosure is not limited to the aforementioned embodiments, and includes a variety of modifications. For example, although the aforementioned embodiments have been described in detail to clearly illustrate the present disclosure, the present disclosure need not include all of the configurations described in the embodiments. It is possible to replace a part of a configuration of an embodiment with a configuration of another embodiment. In addition, it is also possible to add, to a configuration of an embodiment, a configuration of another embodiment. Further, it is also possible to, for a part of a configuration of each embodiment, add, remove, or substitute a configuration of another embodiment.

DESCRIPTION OF SYMBOLS

1 Dielectrophoresis device
10 Electrophoresis portion
11 Solvent retaining portion
12 First electrode
13 Second electrode
14 p-type silicon layer
14A n-type silicon layer
15 n⁻-type silicon layer
15A p⁻-type silicon layer
16 p-type silicon layer
16A n-type silicon layer
17 i-type silicon layer
18 i-type silicon layer
20 AC power source
30 Light source
40 CCD camera
50 Controller
D1 to D6 Photodiode
PT Cell
SL Solvent

What is claimed is:

1. A dielectrophoresis device comprising:
a solvent retaining portion containing a solvent including micro-objects to be manipulated;
a first electrode disposed at a first surface side of the solvent retaining portion;
a second electrode disposed at a second surface side of the solvent retaining portion; and
silicon semiconductor layers disposed between the first electrode and the second electrode,
wherein the silicon semiconductor layers include:
a first silicon layer of a first conductivity type with a first impurity concentration;
a second silicon layer of a second conductivity type with a second impurity concentration, the second silicon layer contacting the first silicon layer, the second impurity concentration being smaller than the first impurity concentration, the second conductivity type being different from the first conductivity type; and
a third silicon layer of the first conductivity type with a third impurity concentration, the third silicon layer contacting the second silicon layer, the third impurity concentration being larger than the second impurity concentration,
wherein the first silicon layer and the second silicon layer form a first photodiode having a first polarity, and
wherein the second silicon layer and the third silicon layer form a second photodiode having a second polarity opposite to the first polarity and being connected in series to the first photodiode.

2. The dielectrophoresis device according to claim 1, further comprising:
a fourth silicon layer that is an intrinsic semiconductor layer formed between the first silicon layer and the second silicon layer; and
a fifth silicon layer that is an intrinsic semiconductor layer formed between the second silicon layer and the third silicon layer.

* * * * *